US012144145B2

(12) United States Patent
Chehade et al.

(10) Patent No.: US 12,144,145 B2
(45) Date of Patent: Nov. 12, 2024

(54) DATA CENTER RACK SYSTEM WITH INTEGRATED LIQUID AND DIELECTRIC IMMERSION COOLING

(71) Applicant: OVH, Roubaix (FR)

(72) Inventors: Ali Chehade, Moncheaux (FR); Gregory Francis Louis Bauchart, Wattrelos (FR); Alexandre Alain Jean-Pierre Meneboo, Harnes (FR)

(73) Assignee: OVH, Roubaix (FR)

( * ) Notice: Subject to any disclaimer, the term of this patent is extended or adjusted under 35 U.S.C. 154(b) by 103 days.

(21) Appl. No.: 17/698,037

(22) Filed: Mar. 18, 2022

(65) Prior Publication Data

US 2022/0322572 A1   Oct. 6, 2022

(30) Foreign Application Priority Data

Apr. 1, 2021  (EP) .................................... 21305427
Aug. 31, 2021 (EP) .................................... 21306189

(51) Int. Cl.
*H05K 7/20* (2006.01)
*F28D 21/00* (2006.01)
(Continued)

(52) U.S. Cl.
CPC ......... *H05K 7/20236* (2013.01); *F28D 21/00* (2013.01); *F28F 3/027* (2013.01);
(Continued)

(58) Field of Classification Search
CPC ........... H05K 7/20236; H05K 7/20772; H05K 7/20245
See application file for complete search history.

(56) References Cited

U.S. PATENT DOCUMENTS 2,115,501 A    4/1938 Sergius
2,316,296 A    4/1943 Simonds
(Continued)

FOREIGN PATENT DOCUMENTS

CN    201898432 U    7/2011
CN    103687443 A    3/2014
(Continued)

OTHER PUBLICATIONS

Office Action with regard to the counterpart U.S. Appl. No. 17/697,452 mailed May 11, 2023.
(Continued)

*Primary Examiner* — Zachary Pape
(74) *Attorney, Agent, or Firm* — BCF LLP

(57) ABSTRACT

A rack system for use, e.g., in data centers is disclosed. The rack system includes a rack frame and a rack-mounted assembly, including an electronic device disposed within the rack-mounted assembly, the electronic device including a heat-generating component. The heat-generating component is in thermal contact with a liquid cooling block through which a channelized cooling fluid is conveyed. The electronic device is immersed in a dielectric immersion cooling liquid. The rack-mounted assembly includes a non-sealed immersion case in which the electronic device is immersed in the dielectric immersion cooling liquid, the non-sealed immersion case configured to permit the rack-mounted assembly to be individually inserted into or removed from the rack frame. Also disclosed are container-based data center modules based on the disclosed rack system, and a data center using numerous such container-based modules.

16 Claims, 10 Drawing Sheets

(51) Int. Cl.
  *F28F 3/02* (2006.01)
  *G06F 1/20* (2006.01)
  *H01L 23/44* (2006.01)
  *H01L 23/473* (2006.01)
  *H05K 7/14* (2006.01)

(52) U.S. Cl.
  CPC ............... *G06F 1/20* (2013.01); *G06F 1/206* (2013.01); *H01L 23/44* (2013.01); *H01L 23/473* (2013.01); *H05K 7/1488* (2013.01); *H05K 7/1489* (2013.01); *H05K 7/20245* (2013.01); *H05K 7/20254* (2013.01); *H05K 7/20263* (2013.01); *H05K 7/20272* (2013.01); *H05K 7/203* (2013.01); *H05K 7/20327* (2013.01); *H05K 7/20336* (2013.01); *H05K 7/20763* (2013.01); *H05K 7/20772* (2013.01); *H05K 7/20781* (2013.01); *H05K 7/20809* (2013.01); *H05K 7/20818* (2013.01); *F28D 2021/0029* (2013.01); *G06F 2200/201* (2013.01)

(56) References Cited

U.S. PATENT DOCUMENTS

| | | |
|---|---|---|
| 3,938,689 A | 2/1976 | De Munnik |
| 4,279,966 A | 7/1981 | Wakana et al. |
| 4,619,316 A | 10/1986 | Nakayama et al. |
| 4,888,664 A | 12/1989 | Rojc |
| 5,268,814 A | 12/1993 | Yakubowski |
| 5,307,956 A | 5/1994 | Richter et al. |
| 5,669,524 A | 9/1997 | Loedel |
| 5,907,473 A | 5/1999 | Przilas et al. |
| 6,023,934 A | 2/2000 | Gold |
| 6,746,388 B2 | 6/2004 | Edwards et al. |
| 6,847,525 B1 | 1/2005 | Smith et al. |
| 6,883,593 B2 | 4/2005 | Johnson et al. |
| 6,899,164 B1 | 5/2005 | Li et al. |
| 7,369,410 B2 | 5/2008 | Chen et al. |
| 7,403,392 B2 | 7/2008 | Attlesey et al. |
| 7,414,845 B2 | 8/2008 | Attlesey et al. |
| 7,527,085 B2 | 5/2009 | Ijima et al. |
| 7,724,517 B2 | 5/2010 | Attlesey et al. |
| 7,885,070 B2 | 2/2011 | Campbell et al. |
| 7,900,796 B2 | 3/2011 | Ungrady et al. |
| 7,905,106 B2 | 3/2011 | Attlesey |
| 7,911,782 B2 | 3/2011 | Attlesey et al. |
| 7,911,793 B2 | 3/2011 | Attlesey |
| 8,009,419 B2 | 8/2011 | Attlesey et al. |
| 8,014,150 B2 | 9/2011 | Campbell et al. |
| 8,089,764 B2 | 1/2012 | Attlesey |
| 8,089,765 B2 | 1/2012 | Attlesey |
| 8,089,766 B2 | 1/2012 | Attlesey |
| 8,291,964 B2 | 10/2012 | Hwang et al. |
| 8,305,759 B2 * | 11/2012 | Attlesey ............. H05K 7/20772 165/80.4 |
| 8,467,189 B2 | 6/2013 | Attlesey |
| 8,619,425 B2 | 12/2013 | Campbell et al. |
| 8,654,529 B2 | 2/2014 | Tufty et al. |
| 8,934,244 B2 | 1/2015 | Shelnutt et al. |
| 8,953,317 B2 | 2/2015 | Campbell et al. |
| 9,049,800 B2 | 6/2015 | Shelnutt et al. |
| 9,051,502 B2 | 6/2015 | Sedarous et al. |
| 9,086,859 B2 | 7/2015 | Tufty et al. |
| 9,128,681 B2 | 9/2015 | Tufty et al. |
| 9,144,179 B2 | 9/2015 | Shelnutt et al. |
| 9,155,230 B2 | 10/2015 | Eriksen |
| 9,176,547 B2 | 11/2015 | Tufty et al. |
| 9,195,282 B2 | 11/2015 | Shelnutt et al. |
| 9,223,360 B2 | 12/2015 | Tufty et al. |
| 9,328,964 B2 | 5/2016 | Shelnutt et al. |
| 9,335,802 B2 | 5/2016 | Shelnutt et al. |
| 9,351,429 B2 | 5/2016 | Shelnutt et al. |
| 9,382,914 B1 | 7/2016 | Sharfi |
| 9,426,927 B2 | 8/2016 | Shafer et al. |
| 9,436,235 B2 | 9/2016 | Damaraju et al. |
| 9,464,854 B2 | 10/2016 | Shelnutt et al. |
| 9,529,395 B2 | 12/2016 | Franz et al. |
| 9,699,938 B2 | 7/2017 | Shelnutt et al. |
| 9,699,939 B2 | 7/2017 | Smith |
| 9,717,166 B2 | 7/2017 | Eriksen |
| 9,756,766 B2 | 9/2017 | Best |
| 9,773,526 B2 | 9/2017 | Shelnutt et al. |
| 9,781,859 B1 | 10/2017 | Wishman et al. |
| 9,795,065 B2 | 10/2017 | Shelnutt et al. |
| 9,839,164 B2 | 12/2017 | Shelnutt et al. |
| 9,844,166 B2 | 12/2017 | Shelnutt et al. |
| 9,921,622 B2 | 3/2018 | Shelnutt et al. |
| 9,968,010 B2 | 5/2018 | Shelnutt et al. |
| 9,992,914 B2 | 6/2018 | Best et al. |
| 10,010,013 B2 | 6/2018 | Shelnutt et al. |
| 10,018,425 B2 | 7/2018 | Shelnutt et al. |
| 10,020,242 B2 | 7/2018 | Katsumata et al. |
| 10,064,314 B2 | 8/2018 | Shelnutt et al. |
| 10,104,808 B2 | 10/2018 | Scharinger et al. |
| 10,130,008 B2 | 11/2018 | Shepard et al. |
| 10,143,113 B2 | 11/2018 | Shelnutt et al. |
| 10,143,114 B2 | 11/2018 | Shelnutt et al. |
| 10,146,231 B2 | 12/2018 | Shelnutt et al. |
| 10,149,408 B2 | 12/2018 | Fujiwara et al. |
| 10,156,873 B2 | 12/2018 | Shelnutt et al. |
| 10,172,262 B2 | 1/2019 | Shelnutt et al. |
| 10,206,312 B2 | 2/2019 | Shelnutt et al. |
| 10,212,857 B2 | 2/2019 | Eriksen |
| 10,225,958 B1 | 3/2019 | Gao |
| 10,238,010 B2 | 3/2019 | Shelnutt et al. |
| 10,271,456 B2 | 4/2019 | Tufty et al. |
| 10,321,609 B2 | 6/2019 | Hirai et al. |
| 10,331,144 B2 | 6/2019 | Shelnutt et al. |
| 10,399,190 B2 | 9/2019 | North et al. |
| 10,542,635 B2 | 1/2020 | Nishiyama |
| 10,598,441 B2 | 3/2020 | Kawabata et al. |
| 10,617,042 B2 | 4/2020 | Shelnutt et al. |
| 10,622,283 B2 | 4/2020 | Leobandung |
| 10,624,236 B2 | 4/2020 | Inano et al. |
| 10,624,242 B2 | 4/2020 | Best |
| 10,638,641 B2 | 4/2020 | Franz et al. |
| 10,645,841 B1 | 5/2020 | Mao et al. |
| 10,653,036 B1 | 5/2020 | Gao |
| 10,667,434 B1 | 5/2020 | Mao et al. |
| 10,674,641 B2 | 6/2020 | Shepard et al. |
| 10,716,238 B2 * | 7/2020 | Brink ................ H05K 7/20772 |
| 10,729,039 B2 | 7/2020 | Shelnutt et al. |
| 10,791,647 B1 | 9/2020 | Miyamura et al. |
| 10,809,011 B2 | 10/2020 | Chu et al. |
| 10,871,807 B2 | 12/2020 | Best et al. |
| 10,888,032 B2 | 1/2021 | Wakino et al. |
| 10,917,998 B2 | 2/2021 | Shelnutt et al. |
| 10,932,390 B2 | 2/2021 | Korikawa |
| 10,939,580 B2 | 3/2021 | Gao |
| 10,939,581 B1 * | 3/2021 | Chen ................ H05K 7/20781 |
| 10,990,144 B2 | 4/2021 | Wang et al. |
| 11,006,547 B2 | 5/2021 | Gao |
| 11,032,939 B2 | 6/2021 | Tufty et al. |
| 11,071,238 B2 | 7/2021 | Edmunds et al. |
| 11,107,749 B2 | 8/2021 | Taniguchi et al. |
| 11,268,739 B2 | 3/2022 | Wang et al. |
| 11,572,614 B2 | 2/2023 | Sakamoto et al. |
| 11,751,359 B2 | 9/2023 | Heydari |
| 11,822,398 B2 | 11/2023 | Heydari |
| 11,924,998 B2 * | 3/2024 | Hnayno ............ H05K 7/20236 |
| 2002/0159233 A1 | 10/2002 | Patel et al. |
| 2004/0244947 A1 | 12/2004 | Chen |
| 2005/0150637 A1 | 7/2005 | Tan et al. |
| 2005/0248922 A1 | 11/2005 | Chu et al. |
| 2007/0227756 A1 | 10/2007 | Doerr et al. |
| 2009/0146294 A1 | 6/2009 | Hillman et al. |
| 2009/0205590 A1 | 8/2009 | Vetrovec |
| 2009/0260777 A1 | 10/2009 | Attlesey et al. |
| 2010/0103620 A1 | 4/2010 | Campbell et al. |
| 2010/0108292 A1 | 5/2010 | Bhunia et al. |
| 2010/0118494 A1 | 5/2010 | Campbell et al. |
| 2010/0170657 A1 | 7/2010 | Kaslusky |

(56) References Cited

U.S. PATENT DOCUMENTS

| | | |
|---|---|---|
| 2010/0328889 A1 | 12/2010 | Campbell et al. |
| 2011/0026776 A1 | 2/2011 | Liang et al. |
| 2011/0028617 A1 | 2/2011 | Hill et al. |
| 2011/0267768 A1 | 11/2011 | Attlesey |
| 2011/0284194 A1 | 11/2011 | Sarkar et al. |
| 2011/0286177 A1 | 11/2011 | Attlesey |
| 2011/0317367 A1 | 12/2011 | Campbell et al. |
| 2012/0007579 A1 | 1/2012 | Apblett et al. |
| 2012/0014064 A1 | 1/2012 | St Rock et al. |
| 2012/0058588 A1 | 3/2012 | Mayer et al. |
| 2012/0075797 A1 | 3/2012 | Attlesey |
| 2012/0120599 A1 | 5/2012 | Chua et al. |
| 2012/0193068 A1 | 8/2012 | Nemesh et al. |
| 2013/0105120 A1 | 5/2013 | Campbell et al. |
| 2014/0123492 A1 | 5/2014 | Campbell et al. |
| 2014/0216688 A1 | 8/2014 | Shelnutt et al. |
| 2014/0218845 A1 | 8/2014 | Peng et al. |
| 2014/0218861 A1 | 8/2014 | Shelnutt et al. |
| 2014/0321054 A1 | 10/2014 | Kaefer et al. |
| 2015/0061568 A1 | 3/2015 | Martinez |
| 2015/0109730 A1 | 4/2015 | Campbell et al. |
| 2015/0237767 A1 | 8/2015 | Shedd et al. |
| 2015/0330718 A1 | 11/2015 | St Rock et al. |
| 2016/0021793 A1* | 1/2016 | Chen .................. H05K 7/202 |
| | | 361/679.02 |
| 2016/0120059 A1 | 4/2016 | Shedd et al. |
| 2016/0305565 A1 | 10/2016 | Miller et al. |
| 2016/0330874 A1 | 11/2016 | Sato et al. |
| 2016/0360637 A1 | 12/2016 | Harvilchuck et al. |
| 2016/0366792 A1* | 12/2016 | Smith .................. H05K 7/2079 |
| 2017/0105313 A1 | 4/2017 | Shedd et al. |
| 2017/0127565 A1 | 5/2017 | Campbell et al. |
| 2017/0181328 A1 | 6/2017 | Shelnutt et al. |
| 2017/0241721 A1 | 8/2017 | Liang |
| 2017/0265328 A1 | 9/2017 | Sasaki et al. |
| 2018/0008467 A1 | 1/2018 | Cater et al. |
| 2018/0027695 A1 | 1/2018 | Wakino et al. |
| 2018/0042138 A1 | 2/2018 | Campbell et al. |
| 2018/0070477 A1 | 3/2018 | Saito |
| 2018/0084671 A1 | 3/2018 | Matsumoto et al. |
| 2018/0092243 A1 | 3/2018 | Saito |
| 2018/0153058 A1 | 5/2018 | Hirai et al. |
| 2018/0196484 A1 | 7/2018 | Saito |
| 2018/0246550 A1 | 8/2018 | Inaba et al. |
| 2018/0295745 A1 | 10/2018 | De Meijer et al. |
| 2018/0338388 A1* | 11/2018 | Wei .................. H05K 7/20781 |
| 2019/0014685 A1 | 1/2019 | So et al. |
| 2019/0090383 A1 | 3/2019 | Tufty et al. |
| 2019/0098796 A1 | 3/2019 | Wakino et al. |
| 2019/0218101 A1 | 7/2019 | Huang et al. |
| 2019/0223324 A1 | 7/2019 | Le et al. |
| 2019/0297747 A1 | 9/2019 | Wakino et al. |
| 2020/0025451 A1 | 1/2020 | Stone et al. |
| 2020/0093037 A1 | 3/2020 | Enright et al. |
| 2020/0095667 A1 | 3/2020 | Sakamoto et al. |
| 2020/0150731 A1 | 5/2020 | Wang et al. |
| 2020/0196489 A1 | 6/2020 | Chang et al. |
| 2020/0214169 A1 | 7/2020 | Tsunoda |
| 2020/0267872 A1 | 8/2020 | Harada et al. |
| 2020/0288600 A1 | 9/2020 | Gao |
| 2020/0305307 A1 | 9/2020 | Amos et al. |
| 2020/0323100 A1 | 10/2020 | Chiu et al. |
| 2020/0323108 A1 | 10/2020 | Bilan et al. |
| 2020/0389998 A1 | 12/2020 | Tung et al. |
| 2020/0390007 A1 | 12/2020 | Edmunds et al. |
| 2021/0051815 A1 | 2/2021 | Van et al. |
| 2021/0076531 A1 | 3/2021 | Tung et al. |
| 2021/0102294 A1 | 4/2021 | Miljkovic et al. |
| 2021/0112683 A1 | 4/2021 | Mohajer et al. |
| 2021/0185850 A1 | 6/2021 | Kulkarni et al. |
| 2021/0321526 A1 | 10/2021 | Kulkarni et al. |
| 2021/0327787 A1 | 10/2021 | Yang et al. |
| 2021/0385971 A1 | 12/2021 | Gorius et al. |
| 2021/0410292 A1 | 12/2021 | Yang et al. |
| 2021/0410319 A1 | 12/2021 | Manousakis et al. |
| 2021/0410320 A1 | 12/2021 | Yang et al. |
| 2021/0410328 A1 | 12/2021 | Yang et al. |
| 2022/0256744 A1 | 8/2022 | Le et al. |
| 2023/0059446 A1 | 2/2023 | Gao |
| 2024/0152163 A1 | 5/2024 | Heger et al. |

FOREIGN PATENT DOCUMENTS

| | | |
|---|---|---|
| CN | 106681459 A | 5/2017 |
| CN | 107643813 A | 1/2018 |
| CN | 110691490 A | 1/2020 |
| CN | 210630126 U | 5/2020 |
| CN | 211184672 U | 8/2020 |
| CN | 110430725 B | 2/2021 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| TW | I 678 961 B | 12/2019 |
| WO | 2011006150 A1 | 1/2011 |
| WO | 2012162986 A1 | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020223806 A1 | 11/2020 |
| WO | 2020234600 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

Office Action with regard to the counterpart U.S. Appl. No. 17/701,422 mailed Mar. 28, 2023.
Office Action with regard to the counterpart U.S. Appl. No. 17/697,264 mailed Nov. 22, 2023.
Office Action with regard to the counterpart U.S. Appl. No. 17/697,452 mailed Nov. 22, 2023.
"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.
"IBM's Hot-Water Supercomputer Goes Live", Data Center Knowledge, retrieved on Jul. 19, 2021, 9 pages.
Extended European Search Report with regard to the EP Patent Application No. 21306771.3 completed May 23, 2022.
Extended European Search Report with regard to the EP Patent Application No. 21306173.2 completed Feb. 18, 2022.
Extended European Search Report with regard to the EP Patent Application No. 21306174.0 completed Feb. 14, 2022.
Extended European Search Report with regard to the EP Patent Application No. 21306172.4 completed Feb. 15, 2022.
English Abstract for JP2020065002 retrieved on Espacenet on Jun. 2, 2022.
Extended European Search Report with regard to the EP Patent Application No. 21306186.4 completed Feb. 10, 2022.

(56) References Cited

OTHER PUBLICATIONS

Extended European Search Report with regard to the EP Patent Application No. 21306187.2 completed Feb. 10, 2022.
Extended European Search Report with regard to the EP Patent Application No. 21306175.7 completed Apr. 8, 2022.
Extended European Search Report with regard to the EP Patent Application No. 21306188.0 completed Feb. 10, 2022.
English Abstract for JPH043451 retrieved on Feb. 22, 2022.
Extended European Search Report with regard to the EP Patent Application No. 21306171.6 completed Feb. 11, 2022.
Extended European Search Report with regard to the EP Patent Application No. 21306189.8 completed Feb. 10, 2022.
Extended European Search Report with regard to the EP Patent Application No. 21306170.8 completed Feb. 12, 2022.
English Abstract for NL1006486 retrieved on Espacenet on Jun. 3, 2022.
Notice of Allowance with regard to the counterpart U.S. Appl. No. 17/691,494 mailed Apr. 17, 2023.
Office Action with regard to the counterpart U.S. Appl. No. 17/694,765 mailed Dec. 21, 2023.
Extended European Search Report with regard to the counterpart EP Patent Application No. 22305018.8 completed Jun. 24, 2022.
Office Action with regard to the counterpart U.S. Appl. No. 17/698,480 mailed Sep. 7, 2023.
International Search Report and Written Opinion with regard to PCTIB2022053071 mailed Jun. 28, 2022.
International Search Report and Written Opinion with regard to PCT/IB2022/052975 mailed Jun. 20, 2022.
International Search Report and Written Opinion with regard to PCTIB2022052330 mailed May 30, 2022.
International Search Report and Written Opinion with regard to PCT/IB2022/052976 mailed Jun. 17, 2022.
International Search Report and Written Opinion with regard to PCT/IB2022/052977 mailed Jun. 20, 2022.
European Search Report with regard to EP21306170.8 completed Feb. 12, 2022.
European Search Report with regard to EP21306189.8 completed Feb. 10, 2022.
Notice of Allowance with regard to the counterpart U.S. Appl. No. 17/690,839 mailed Mar. 5, 2024.
Office Action with regard to the counterpart U.S. Appl. No. 17/697,616 mailed Feb. 26, 2024.
Office Action with regard to the counterpart U.S. Appl. No. 17/690,833 mailed Mar. 28, 2024.
Office Action with regard to the counterpart U.S. Appl. No. 17/697,452 mailed Mar. 25, 2024.
Office Action with regard to te counterpart CN Patent Application No. 2022103375051 issued May 11, 2024.
Office Action with regard to te counterpart U.S. Appl. No. 17/690,839 issued Jun. 25, 2024.
Office Action with regard to te counterpart U.S. Appl. No. 17/698,480 issued Jul. 3, 2024.
Notice of Allowance with regard to te counterpart U.S. Appl. No. 17/697,616 issued Jul. 23, 2024.
Office Action with regard to te counterpart CN Patent Application No. 2022103326074 issued Jul. 29, 2024.
Office Action with regard to the counterpart CN Patent Application No. 2022103375314 issued Aug. 12, 2024.
Notice of Allowance with regard to the counterpart U.S. Appl. No. 17/707,200 issued Aug. 15, 2024.
Office Action with regard to the counterpart U.S. Appl. No. 17/697,452 issued Sep. 6, 2024.
Office Action with regard to the counterpart CN Patent Application No. 2022103478109 issued Aug. 30, 2024.

* cited by examiner

DATA CENTER RACK SYSTEM WITH INTEGRATED LIQUID AND DIELECTRIC IMMERSION COOLING

CROSS-REFERENCE

The present patent application claims priority from European Patent Application Number 21305427.3, filed on Apr. 1, 2021 and from European Patent Application Number 21306189.8, filed on Aug. 31, 2021, the disclosures of both of which is incorporated by reference herein in their entirety.

FIELD OF TECHNOLOGY

The present technology relates to a rack system for electronic equipment. In particular, the present technology relates to a rack system for immersion-cooled electronic equipment.

BACKGROUND

Electronic equipment, for example servers, memory banks, computer discs, and the like, is conventionally grouped in equipment racks. Large data centers and other large computing facilities may contain thousands of racks supporting thousands or even tens of thousands of servers.

The racks, including equipment mounted in their backplanes, consume large amounts of electric power and generate significant amounts of heat. Cooling needs are important in such racks. Some electronic devices, such as processors, generate so much heat that they could fail within seconds in case of a lack of cooling.

Fans are commonly mounted within equipment racks to provide forced ventilation cooling to rack-mounted equipment. This solution merely displaces some of the heat generated within the racks to the general environment of the data center, and also takes up significant space on the racks, e.g., reducing the number of servers per square meter of data center space.

Liquid cooling, in particular water cooling, has recently been introduced as an addition or replacement to traditional forced-air cooling. Cold plates, for example water blocks having internal channels for water circulation, may be mounted on heat-generating components, such as processors to displace heat from the processors toward heat exchangers. Air-to-liquid heat exchangers, for example finned tubes heat exchangers similar to radiators, may be mounted to the racks to absorb and transport some of this displaced heat toward external cooling equipment, for example cooling towers, located outside of the data center.

Immersion cooling (sometimes called immersive cooling) was more recently introduced. Electronic components are inserted in a container that is fully or partially filled with a non-conducting cooling liquid, for example an oil-based dielectric cooling liquid. Good thermal contact is obtained between the electronic components and the dielectric cooling liquid. However, an electronic component, for example a server, includes some devices such as processors may generate most of the heat while other devices such as memory boards may generate much less heat. It is generally required to ensure circulation of the dielectric cooling liquid, within the container, at a level that is sufficient to cool the hottest devices within the electronic components. This requires the use of efficient pumps that consume a significant amount of energy. Heat sinks may be mounted on some heat-generating devices. Some other heat-generating devices may have porous surfaces so that the contact between these devices and the dielectric cooling liquid is more intimate and thus more thermally efficient. These solutions only provide a modest reduction of the amount of energy required to operate the pumps that circulation the dielectric cooling liquid within the container.

Immersion cooling systems also commonly take the form of large tanks in which the electronic devices are submerged. These tanks and the liquid circulation and heat exchange systems that are conventionally used with them typically require a significant amount of space, and in many instances are not intended to be mounted in racks. While there are some immersion-cooled devices that can be mounted in racks, this typically requires that the cases surrounding the electronic devices and immersion cooling liquid in which they are submerged be sealed, to prevent spillage of the cooling liquids, and for use in "two phase" immersion systems in which the immersion cooling liquid may boil within the case. Such sealed systems may be expensive to manufacture, and may involve pumping systems to fill and drain the cases.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art. In particular, such shortcomings may comprise (1) inability to address the cooling needs to devices that generate most of the heat; (2) significant power consumption of the cooling systems; and/or (3) inability to use current cooling technologies, such as immersion cooling, in high-density data centers.

In accordance with one aspect of the present disclosure, the technology is implemented as a rack system including a rack frame and a rack-mounted assembly, including an electronic device disposed within the rack-mounted assembly, the electronic device including a heat-generating component. The heat-generating component is in thermal contact with a liquid cooling block through which a channelized cooling fluid is conveyed. The electronic device is immersed in a dielectric immersion cooling liquid. The rack-mounted assembly includes a non-sealed immersion case in which the electronic device is immersed in the dielectric immersion cooling liquid. The non-sealed immersion case is configured to be non-sealed at all times, including during operation of the electronic device, such that the non-sealed immersion cooling case cannot be used for dual-phase immersion cooling. The non-sealed immersion case is further configured to permit the rack-mounted assembly to be individually inserted into or removed from the rack frame.

In some embodiments, the rack-mounted assembly is mounted vertically with respect to the rack frame.

In some embodiments, the dielectric immersion cooling liquid is induced by gravity to flow over the electronic device.

In some embodiments, the dielectric immersion cooling liquid is contained within the non-sealed immersion case and circulates within the non-sealed immersion case due to convection.

In some of these embodiments, the rack-mounted assembly includes a convection-inducing element in thermal contact with at least a portion of the dielectric immersion cooling liquid and configured to induce convection within the dielectric immersion cooling liquid.

In some embodiments, the channelized cooling fluid is conveyed through the convection-inducing element.

In some embodiments, the convection-inducing element comprises a serpentine convection coil.

In some embodiments, the channelized cooling fluid is conveyed through a loop that includes both the liquid cooling block in thermal contact with the heat-generating component and the convection-inducing element.

In some embodiments, the density of the dielectric immersion cooling liquid is lower than the density of the channelized cooling fluid.

In some embodiments, a lower portion of the non-sealed immersion case includes a sensor configured to detect a leak of the channelized cooling fluid.

In some embodiments, a lower portion of the non-sealed immersion case includes an outlet configured for draining leaked channelized cooling fluid.

In some embodiments, the channelized cooling fluid is the same as the dielectric immersion cooling liquid.

In some embodiments, a plurality of vertically oriented rack-mounted assemblies are mounted adjacent to each other in the rack frame.

In another aspect, the technology is implemented in a container-based data center module including numerous rack systems as summarized above.

In a further aspect, the technology is implemented as a modular data center including numerous such container-based data center modules.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

These and other features, aspects and advantages of the present technology will become better understood with regard to the following description, appended claims and accompanying drawings where:

Figure 1:
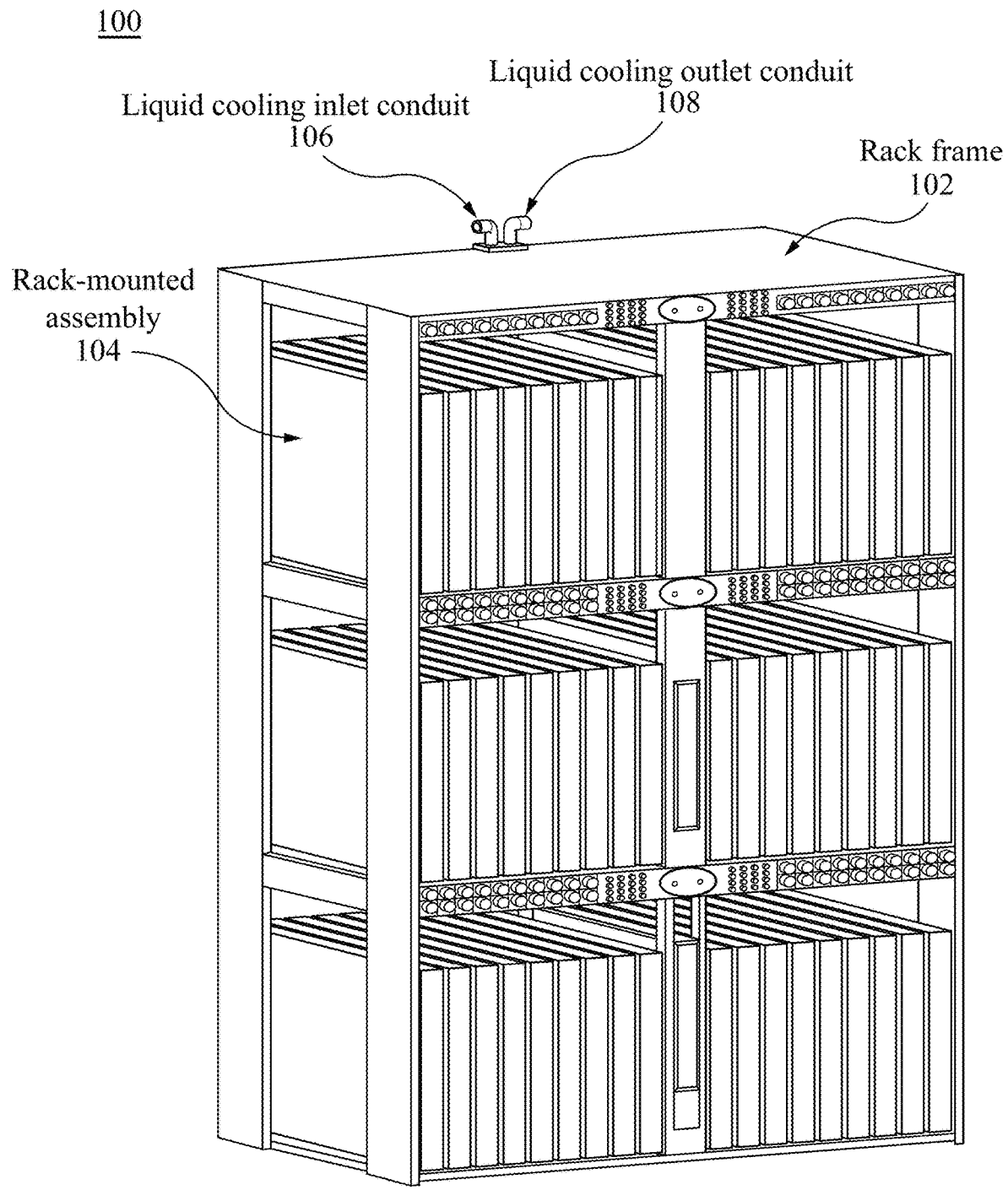
FIG. 1 shows a perspective view of a rack system for housing numerous rack-mounted assemblies, in accordance with various embodiments of the present disclosure.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

In an aspect, the present technology introduces a cooling system having two pumps for circulating a dielectric cooling liquid in a container that receives one or more electronic components immersed in the dielectric cooling liquid. One pump is used to cause a circulation of the dielectric cooling liquid, broadly within the container. Another pump is used to direct a flow of the dielectric cooling liquid toward the electronic components. As such, the direct flow provided enhanced cooling of specific devices of the electronic components, such as for example processors that generate the most thermal energy, while the broad circulation of the liquid cooling within the container allows cooling other devices of the electronic components while generally controlling the temperature of the dielectric cooling liquid.

With these fundamentals in place, we will now consider some non-limiting examples to illustrate various implementations of aspects of the present disclosure.

Non-Sealed Immersion Cooling Rack System

FIG. 1 shows a perspective view of a rack system 100 for housing numerous rack-mounted assemblies 104, in accordance with various embodiments of the present disclosure. As shown, the rack system 100 may include a rack frame 102, rack-mounted assemblies 104, a liquid cooling inlet conduit 106 and a liquid cooling outlet conduit 108. As described more fully below, in accordance with some embodiments, the rack-mounted assemblies 104 may be oriented vertically with respect to the rack frame 102, resembling books on a library shelf. This arrangement may provide for mounting a large number of such rack-mounted assemblies 104 in the rack frame 102, relative to conventional arrangements, particularly with respect to conventional arrangements of immersion-cooled rack-mounted assemblies.

Figure 2:
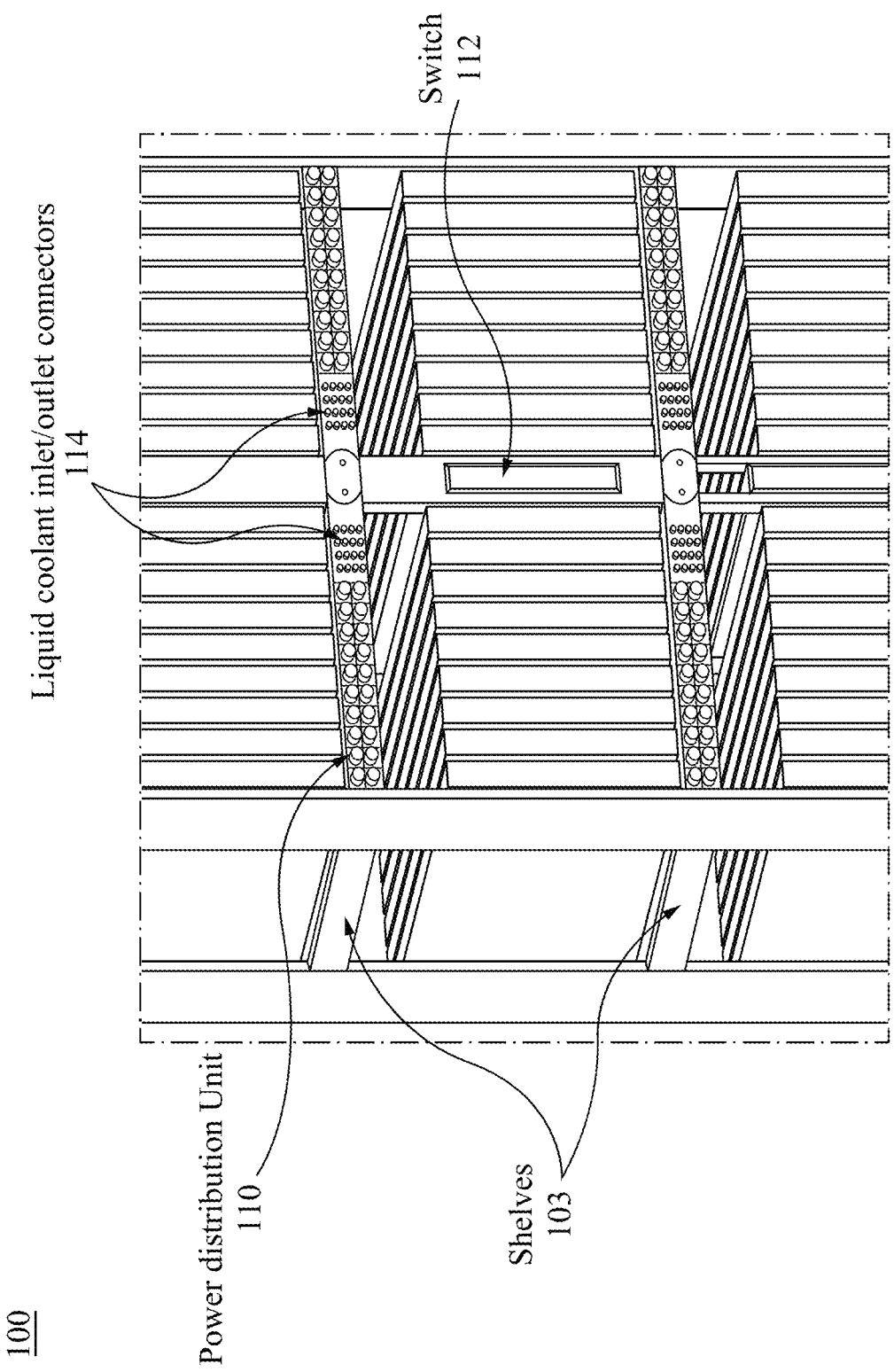
FIG. 2 shows another perspective view of the rack system, in accordance with various embodiments of the present disclosure.

FIG. 2 shows another perspective view of the rack system 100, in accordance with various embodiments of the present disclosure. As shown, the rack system 100 may further comprise a power distribution unit 110, a switch 112, and liquid coolant inlet/outlet connectors 114. It is to be noted that the rack system 100 may include other components such as heat exchangers, cables, pumps or the like, however, such components have been omitted from FIGS. 1 and 2 for clarity of understanding. As shown in FIGS. 1 and 2, the rack frame 102 may include shelves 103 to accommodate one or more rack-mounted assemblies 104. As noted above, in some embodiments, the one or more rack-mounted assemblies 104 may be arranged vertically with respect to the on the shelves 103. In embodiments, guide members (not shown) may be used on the shelves 103 to guide the rack-mounted assemblies 104 into position during racking and de-racking, and to provide proper spacing between the rack-mounted assemblies 104 for racking and de-racking.

Figure 3:
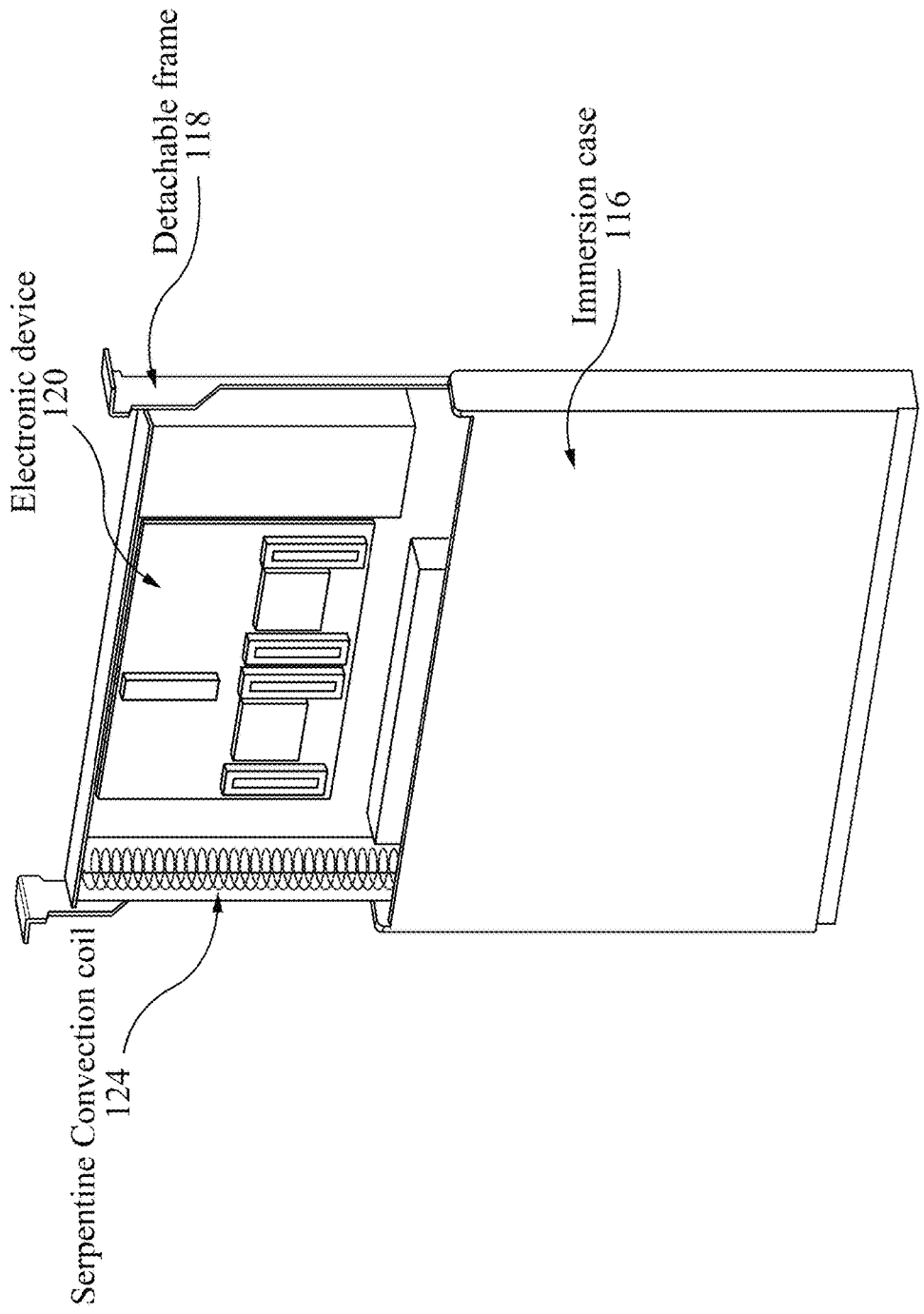
FIG. 3 shows a perspective view of a rack-mounted assembly, in accordance with various embodiments of the disclosure.

FIG. 3 shows a perspective view of a rack-mounted assembly 104, in accordance with various embodiments of the disclosure. As shown, the rack-mounted assembly 104 may include a non-sealed immersion case 116 and a detachable frame 118. The detachable frame 118 may hold an electronic device 120 and may be immersed in the non-sealed immersion case 116.

It is contemplated that the electronic device 120 may generate a significant amount of heat. Consequently, the rack system 100 may use a cooling system to cool down the electronic device 120 to prevent the electronic device 120 from being damaged. In some embodiments, the cooling system may be an immersion cooling system. As used herein, an immersion cooling system is a cooling system in which the electronic device is in direct contact with a non-conductive (dielectric) cooling liquid, which either flows over at least portions of the electronic device, or in which at least portions of the electronic device are submerged. For example, in the rack-mounted assembly 104, the non-sealed immersion case 116 may contain an immersion cooling liquid (not shown in FIG. 3). Further, the detachable frame 118 including the electronic device 120 may be submerged in the immersion cooling case 116. In some embodiments, the immersion cooling liquid and the detachable frame 118 may be inserted into the non-sealed immersion case 116 via an opening 122 at the top of the non-sealed immersion case 116. In some embodiments, the opening 122 may remain at least partially open during operation of the electronic device 120, providing a non-sealed configuration for the non-sealed immersion case 116. Such non-sealed configurations may be easier to manufacture and maintain than sealed configurations. As would be understood from the description of the technology, the non-sealed immersion case 116 remains non-sealed at all times, including during operation of the electronic device 120.

It will be understood by those of ordinary skill in the art that a non-sealed configuration of an immersion case, such as is described herein, would not be usable in a dual-phase immersion system. This is because vapor from the boiling immersion liquid in such a dual-phase immersion system would escape into the surrounding atmosphere through the non-sealed immersion case and would be lost. In dual-phase immersion systems, this loss may occur to a limited extent even during installation and removal of the electronic device from the immersion liquid. For these reasons, immersion cases in dual-phase immersion systems need to be kept sealed during operation, and (in some instances) even when the electronic device is not in operation. One of ordinary skill in the art would understand this condition on the use of a dual-phase immersion system, and would therefore understand that a non-sealed immersion case, such as is described herein, would not be suitable for use with a dual-phase immersion system.

In some embodiments, the non-sealed immersion case 116 may also include a convection-inducing structure to cool/induce convection in the dielectric immersion liquid. For example, the convection-inducing structure may be a serpentine convection coil 124 attached to the detachable frame 118. The serpentine convection coil 124 may be fluidly coupled to the liquid cooling inlet conduit 106 and the liquid cooling outlet conduit 108 via the liquid coolant inlet/outlet connectors 114. The serpentine convection coil 124 may allow a flow of a circulating cooling liquid. The circulating cooling liquid, by means of convection, may cool down the dielectric immersion cooling system.

Further, the electronic device 120 may be connected to the power distribution unit 110 and the switch 112 via power and network cables (not illustrated) to facilitate powering the electronic device 120 and to facilitate communication between the electronic device 120 and external devices (not illustrated) through the switch 112.

In some embodiments, in addition to immersion cooling, certain heat-generating components of the electronic device 120 may be cooled using one or more thermal transfer devices, which may also be called "cold plates" or "water blocks" (although a liquid circulating through the "water blocks" may be any of a wide variety of known thermal transfer liquids, rather than water). Examples of heat-generating components that may be cooled using such a thermal transfer devices include, but are not limited to, central processing units (CPUs), graphics processing units (GPUs), neural processing units (NPUs), tensor processing units (TPUs), power supply circuitry, and application specific integrated circuits (ASICs), including, for example, ASICs configured for high-speed cryptocurrency mining.

Figure 4:
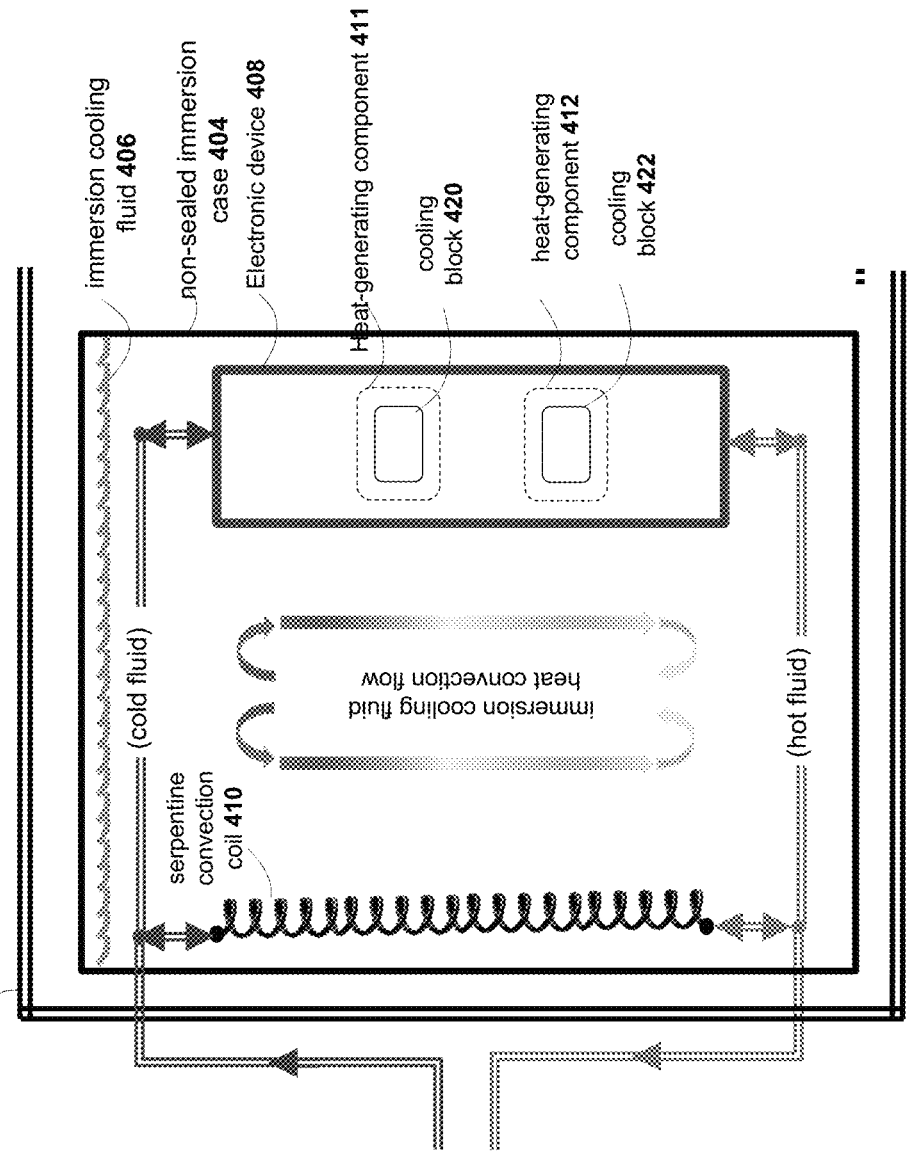
FIG. 4 shows a conceptual block diagram of a rack-mountable, non-sealed hybrid liquid cooling system, in accordance with various embodiments of the disclosure.

FIG. 4 shows a conceptual block diagram of such an embodiment, which may be referred to as a "hybrid" liquid cooling system, since it includes both immersion cooling and a liquid cooling system that circulates a liquid coolant through a loop that includes thermal transfer devices, such as "water blocks" on some heat-generating components of the electronic device. As illustrated in FIG. 4, a hybrid liquid cooling system 400 is housed within a non-sealed immersion case 404, which is part of a rack-mounted assembly (not shown in full in FIG. 4) that is mounted in a rack frame 402, such as is described above with reference to FIGS. 1 and 2. The non-sealed immersion case 404 contains a volume of non-conductive dielectric immersion liquid 406 and at least one electronic device 408 that is submerged in the immersion cooling liquid 406.

The non-sealed immersion case 404 may also contain a serpentine convection coil 410 that is also submerged within the dielectric immersion cooling liquid 406. The serpentine convection coil 410 is structured with multiple hollow-channel coils to provide a high surface area exposure relative to the immersion liquid 406 while also maintaining compact overall length and width dimensions.

With this structure, the serpentine convection coil 410 is configured to cool the ambient temperature and induce natural thermal convection in the dielectric immersion cooling liquid 406 through direct channelized liquid cooling. That is, the serpentine convection coil 410 internally conveys a circulating channelized cooling fluid that operates to cool the immersion cooling liquid 406. The channelized cooling fluid may be a different liquid than the immersion cooling liquid 406. That is, the channelized cooling fluid may include water, alcohol, or any suitable liquid capable of sustaining adequate cooling temperatures.

As noted above, the electronic device 408 includes heat-generating components 411 and 412 that are also submerged within the immersion cooling liquid 406. To provide further cooling to the heat-generating components 411, 412, and as a supplement to the overall immersion cooling of the electronic device, channelized liquid cooling may be used. Cooling blocks 420, 422 may be arranged to be in direct thermal contact with the one or more heat-generating components 411, 412. The cooling blocks 420, 422 are structured to convey the circulating channelized cooling fluid to provide additional cooling to the heat-generating components 411, 412.

The channelized liquid cooling of the hybrid liquid cooling system 400 forms a fluid distribution loop. The fluid distribution loop circulates the channelized cooling fluid through the cooling blocks 420, 422 to cool the heat-generating components 411, 412, and through the serpentine convection coil 410, to cool and induce convection in the immersion cooling liquid 406. After absorbing heat from the heat-generating components 411, 412 and from the immersion cooling liquid 406, the heated channelized cooling fluid is conveyed through a heat exchange system (not shown), the operation of which will generally be familiar to those of skill in the art. The heat exchange system cools the channelized cooling fluid, after which it may be recirculated through the fluid distribution loop.

It will be understood that many additional features, combinations, and variations of such non-sealed immersion and/or hybrid systems. For example, in some embodiments, the channelized cooling fluid (often water, though other fluids may be used) has a higher density than the immersion cooling liquid (e.g., any of a number of commercially-available immersion cooling liquids with a density lower than the density of water, including, e.g., SMARTCOOL-ANT, produced by Submer Technologies, S.L., of Barcelona, Spain, or S5 X, developed jointly by Asperitas, of Amsterdam, Netherlands, and Shell plc, of London, UK). As a result of this, should the channelized cooling fluid leak into the immersion cooling liquid, it will sink to a bottom portion of the non-sealed immersion case. In some embodiments, the presence of the channelized cooling fluid in a bottom portion of the immersion case may be detected by a sensor, which may serve as a leak detection sensor. In some embodiments having this feature, the non-sealed immersion case may be configured to collect and drain such leaked channelized cooling fluid, for example, through an outlet in the bottom portion of the non-sealed immersion case.

In some embodiments, the non-sealed immersion case may include an overflow release (not shown), such as an opening or tube near the top of the non-sealed immersion case, that is configured to permit immersion liquid to flow into an overflow collection channel connected to the rack system in the event of an overflow of the immersion liquid. Because some of the dielectric liquids that are used as immersion liquids may be expensive, such an overflow release may prevent these liquids from being lost in the event of an overflow.

In some embodiments, the convection-inducing structure may not be a serpentine convection coil. For example, in some embodiments, a large cooling plate (not shown) either submerged in the cooling fluid of formed as part of the non-sealed immersion case may be used to induce convection.

Other variations may involve changing the order of the components and/or the serpentine convection coil in the fluid distribution loop. For example, the channelized cooling fluid may flow through the serpentine convection coil before flowing through the cooling blocks. In some embodiments, the serpentine convection coil may be part of a different fluid distribution loop than the cooling blocks.

These variations and additional features may be used in various combinations, and may be used in connection with the embodiments described above, or other embodiments.

Flow-Through Embodiments

Figure 5:
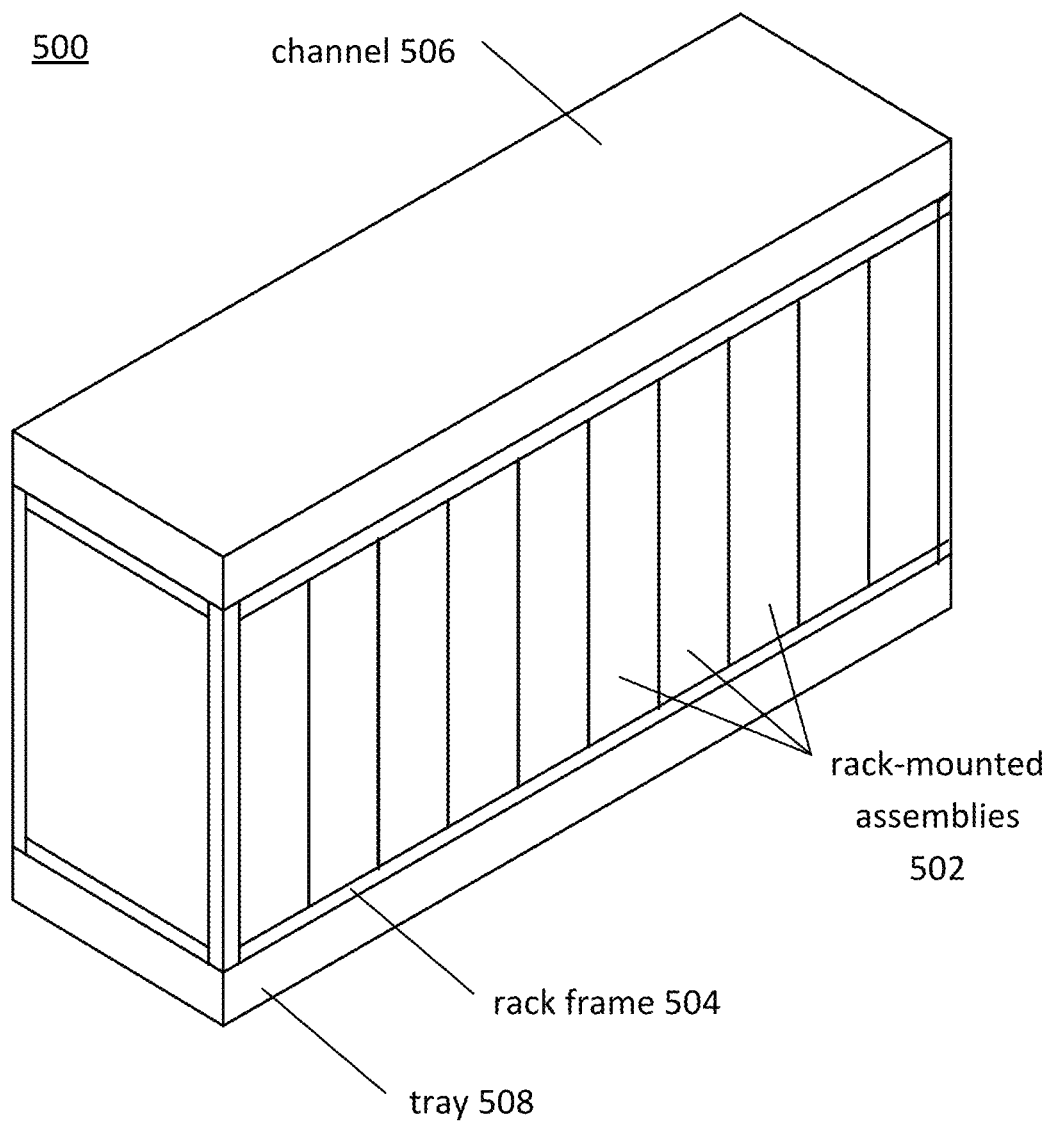
FIG. 5 shows a vertically oriented flow-through non-sealed immersion cooling rack system, in accordance with various embodiments of the disclosure.

Referring to FIGS. 5-8, flow-through embodiments of the technology are described. These embodiments share a common characteristic that the immersion cooling liquid flows over the electronic devices due to gravity. FIG. 5 shows such a rack system 500, in which numerous rack-mounted assemblies 502 are mounted vertically within a rack frame 504. A channel 506 for an immersion cooling liquid (not shown in FIG. 5) is mounted in the rack frame 504 above the rack-mounted assemblies 502, and a tray 508 for receiving immersion cooling liquid is mounted in the rack frame 504 below the rack-mounted assemblies 502. It will be understood that the channel 506 and tray 508 may be most any kind of receptacles capable of holding fluid, such as tanks, containers, and the like.

Figure 6:
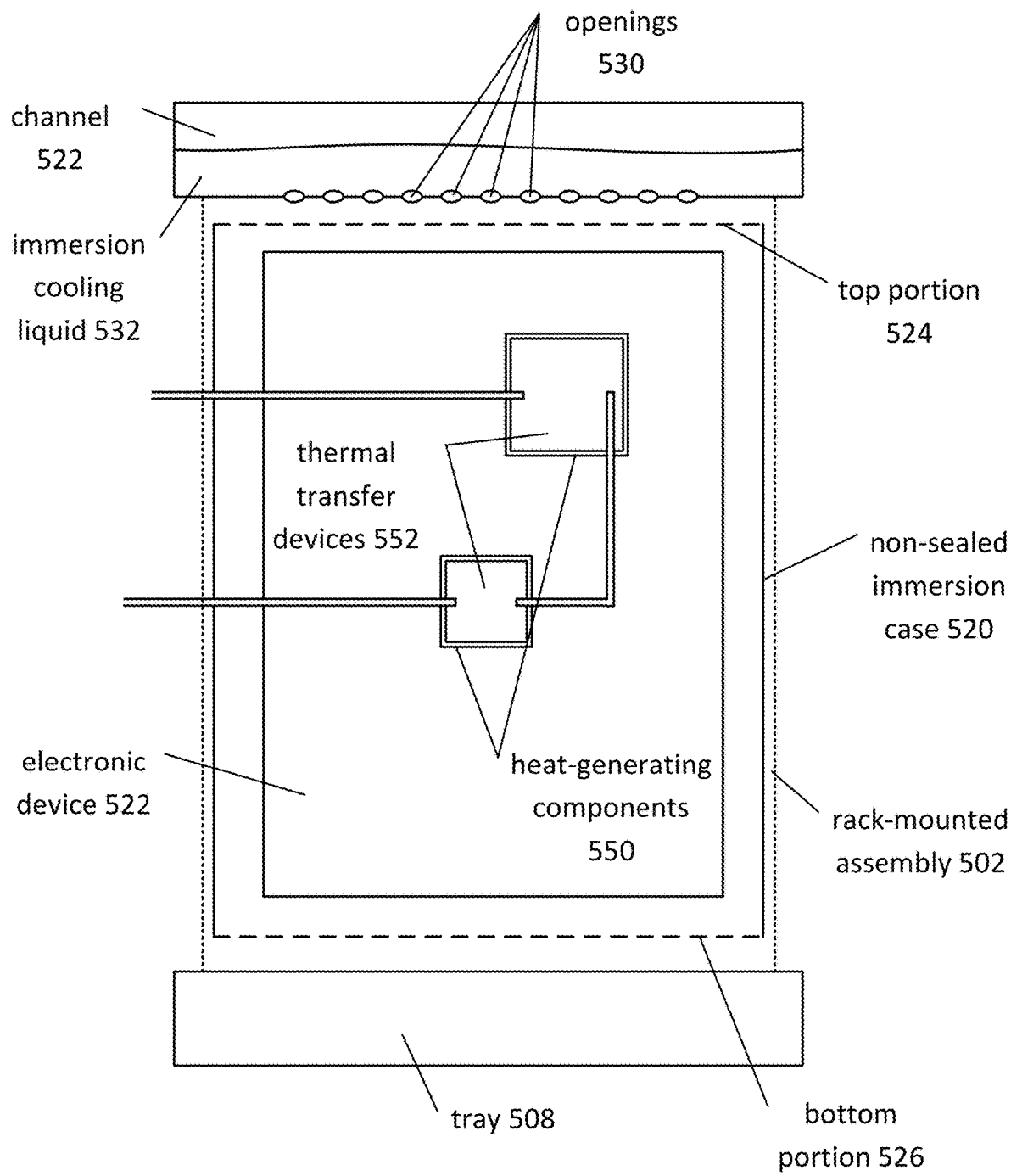
FIG. 6 shows a cut-away view of one of the rack-mounted assemblies that may be mounted in the rack system of FIG. 5.

As seen in FIG. 6, which shows a cut-away view of one of the rack-mounted assemblies 502 of the rack system 500, the rack-mounted assembly 502 includes a non-sealed immersion case 520, in which an electronic device 522 is disposed. A top portion 524 of the non-sealed immersion case 520 is open, as is a bottom portion 526 of the non-sealed immersion case 520. The channel 506 includes openings 530, through which the immersion cooling liquid 532 pours onto the electronic device 522. The immersion cooling liquid 532 flows over the electronic device 522, and into the tray 508. As the immersion cooling liquid 532 flows over the electronic device 522, it absorbs heat from various heat-generating components of the electronic device 522 and conveys the heat away from those components. Heated immersion cooling liquid 532 is removed from the tray 508, e.g. by pumping or by gravity, and is pumped through a heat exchange system (not shown), the operation of which will generally be familiar to those of skill in the art. The heat exchange system cools the immersion cooling liquid 532, after which it is pumped back into a channel, such as the channel 506 of the system 500.

In some embodiments, in addition to immersion cooling, certain heat-generating components 550 of the electronic device 522 may be cooled using one or more thermal transfer devices 552, which may also be called "cold plates" or "water blocks" (although a liquid circulating through the "water blocks" may be any of a wide variety of known thermal transfer liquids, rather than water). Examples of heat-generating components 550 that may be cooled using the thermal transfer devices 552 include, but are not limited to, central processing units (CPUs), graphics processing units (GPUs), neural processing units (NPUs), tensor processing units (TPUs), power supply circuitry, and application specific integrated circuits (ASICs), including, for example, ASICs configured for high-speed cryptocurrency mining.

It will be understood that there are many possible variations of the system 500 as described with reference to FIGS. 5 and 6. For example, in some embodiments, the channel 506 and/or the tray 508 may be parts of a rack-mounted assembly 502, so when the rack-mounted assembly 502 is de-racked, the channel 506 and/or tray 508 associated with that rack-mounted assembly 502 are also removed. In other embodiments, the channel 506 and/or tray 508 may be attached to the rack frame 504, such that when the rack-mounted assembly 502 is de-racked, the channel 506 and/or tray 508 remain attached to the rack frame 504.

Additionally, the channel 506 and tray 508 may be associated with a single rack-mounted assembly 502, or with more than one rack-mounted assembly 502. For example, in some embodiments, the channel 506 may cover the entire width of the rack frame 504, with openings providing immersion cooling liquid to an entire row of rack-mounted assemblies 502. Similarly, the tray 508 may collect immersion cooling liquid from, e.g., an entire row of rack-mounted assemblies 502.

It will similarly be understood that in some embodiments, the immersion cooling liquid 532 may flow over the electronic devices associated with more than one rack-mounted assembly 502 before pouring into the tray 508. For example, the rack-mounted assemblies may be arranged so that the opening in the bottom portion of the non-sealed immersion case of a first rack-mounted assembly is arranged above the opening in the top portion of the non-sealed immersion case of a second rack-mounted assembly, so that when the immersion cooling liquid pours out of the bottom of the first rack-mounted assembly, it pours into the top of the second rack-mounted assembly, to cool the electronic device associated with the second rack-mounted assembly. In this manner, a single stream of immersion cooling liquid may be used to cool numerous vertically aligned rack-mounted assemblies.

Additionally, in some embodiments, the openings 530 may include nozzles (not shown), which may be adjustable to control the flow of the immersion cooling liquid 532 from the channel 506. Such nozzles may also be configured to spray or mist the immersion cooling liquid 532 onto the electronic device rather than pouring or dripping the immersion cooling liquid 532 onto the electronic device. Pressure to accommodate such spraying of the immersion cooling liquid 532 onto the electronic device may be arranged, for example, by filling the channel 506 to increase the hydrostatic pressure or by pumping the immersion cooling liquid 532 through the channel 506 to provide hydraulic pressure.

Figure 7:
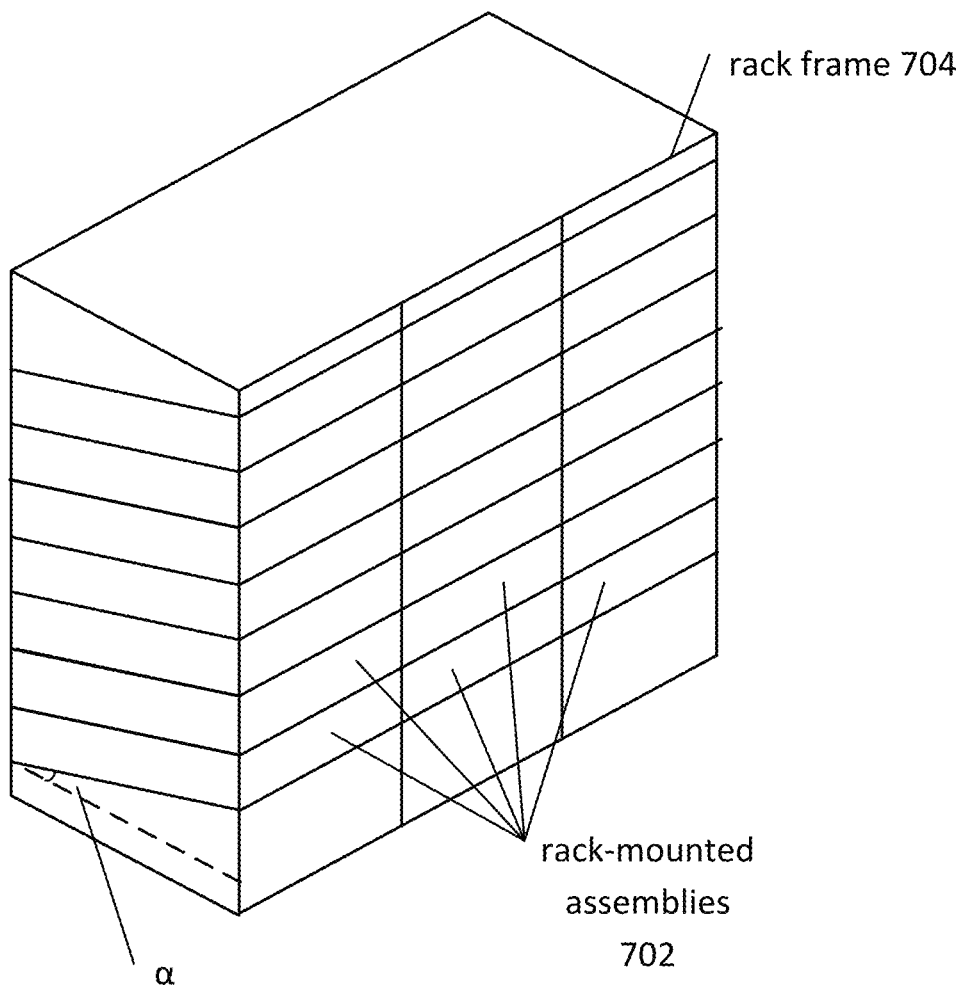
FIG. 7 shows an inclined flow-through non-sealed immersion cooling rack system, in accordance with various embodiments of the disclosure.

FIG. 7 shows an arrangement of a flow-through rack system 700, which operates in a manner similar to the rack system 500, as discussed above. In the rack system 700, a rack frame 704 is configured to hold numerous rack-mounted assemblies 702, mounted at an incline a with respect to the rack frame 704. A channel (not shown) for an immersion cooling liquid (not shown) is mounted in the rack frame 704 above the rack-mounted assemblies 702, and a tray (not shown) for receiving immersion cooling liquid is mounted in the rack frame 704 below the rack-mounted assemblies 702. Alternatively, each of the rack-mounted assemblies 702, or subsets of the rack-mounted assemblies 702 may include a channel for the immersion cooling liquid and a tray for receiving immersion cooling liquid.

Due to the incline a, the immersion cooling liquid from the channels flows by gravity over electronic devices (not shown) mounted within the rack-mounted assemblies 702, to convey heat from the electronics devices. As in the embodiment described above with reference to FIGS. 5 and 6, the immersion cooling liquid flows into the tray, from which it is conveyed through a heat exchanger to be cooled and recirculated through the rack system 700.

Variations similar to those described above with reference to the system 500 of FIGS. 5 and 6 could also be used with the rack system 700. For example, nozzles (not shown) could be used to spray the immersion cooling liquid onto the electronic devices. All such variations and/or combinations of features described herein may be applicable, mutatis mutandis, with the inclined embodiments shown in FIG. 7. Additionally, the incline a may be varied, which will affect the velocity of the flow over the electronic devices due to gravity, and therefore the amount of heat that is conveyed. In general, a steeper incline a (up to a maximum of 90°) will lead to a faster flow of the immersion cooling liquid over the electronic devices.

Figure 8:
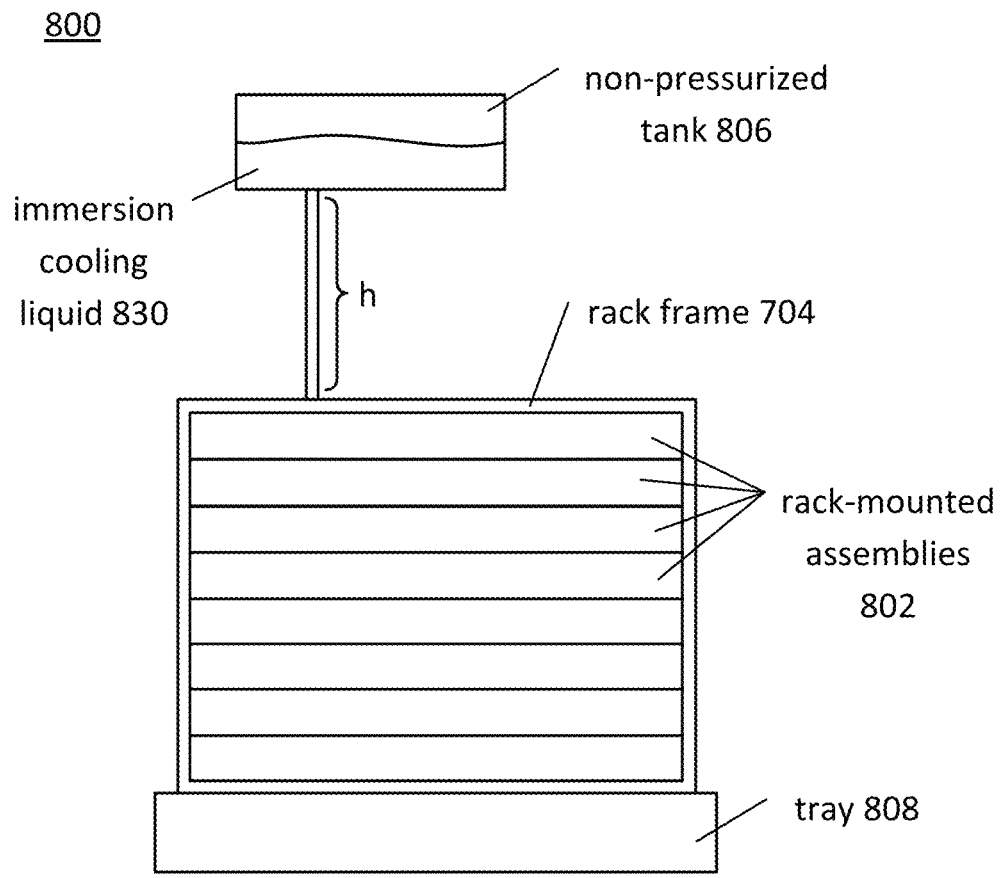
FIG. 8 shows a further flow-through non-sealed immersion cooling rack system, in accordance with various embodiments of the disclosure.

FIG. 8 shows a further embodiment of a flow-through immersion-cooled rack system 800. The system 800 includes a rack frame 804 that is configured to hold numerous rack-mounted assemblies 802. A non-pressurized tank 806 for holding immersion cooling liquid 830 is disposed above the rack frame 804, and a tray 808 collects immersion cooling liquid 830 from the rack-mounted assemblies 802. It will be understood that, as in previous embodiments, the tank 806 and the tray 808 may be any kind of receptacles that are capable of containing a liquid.

The tank 806 may be disposed on a top portion of the rack frame 804 or may be disposed at a height h above the rack frame 804. For example, the tank 806 may be disposed in the ceiling of a data center above the rack frame 804. The static fluid pressure at the level of the rack-mounted assemblies 802 will depend on the height h of the tank 806 above the rack-mounted assemblies 802, with a greater height resulting in a greater static fluid pressure.

The immersion cooling liquid 830 flows over the electronic devices (not shown) housed in the rack-mounted assemblies 802, as is described above. The system 800 may be used in combination with the vertical flow-through rack-mounted assemblies of FIGS. 5-6 (as well as with any variations thereof), the inclined flow-through rack-mounted assemblies of FIG. 7 (as well as with any variations thereof), or with horizontal rack-mounted assemblies 802, as shown in FIG. 8. In the case of the horizontal rack-mounted assemblies 802, the electronic device within the rack-mounted assembly 802 may be mounted at an incline. Alternatively, instead of being poured or sprayed on the electronic devices, the electronic devices may be submerged in the immersion cooling liquid, which flows through the horizontal rack-mounted assemblies at a rate that permits the immersion cooling liquid to cover the electronic device.

As in the other flow-through immersion embodiments, the immersion cooling liquid flows into the tray 808, from which it is conveyed, e.g., by a pump, through a heat exchanger to be cooled and recirculated through the system 800.

Application in a Container-Based Data Center

The various embodiments described above facilitate dense packing of electronic devices in racks, while using immersion cooling as well as liquid-cooled thermal transfer devices, such as "waterblocks" to cool the devices. This use of immersion and liquid cooling provides increased power usage effectiveness, as compared to air cooled systems, as well as eliminating the need for bulky, noisy, and relatively inefficient fan assemblies attached to the racks. In the case of embodiments using convection cooling for circulation of immersion cooling liquid, there may be no need for use of pumps for circulating the immersion cooling liquid, further increasing power usage effectiveness of the cooling system.

It is contemplated that these features may be particularly advantageous in constructing data centers with large numbers of servers. In such data center applications, the electronic devices that are cooled by the various embodiments described above may be server computers (or "servers"), though other electronic devices that are used in data centers may also benefit from the cooling systems of the disclosure.

Figure 9:
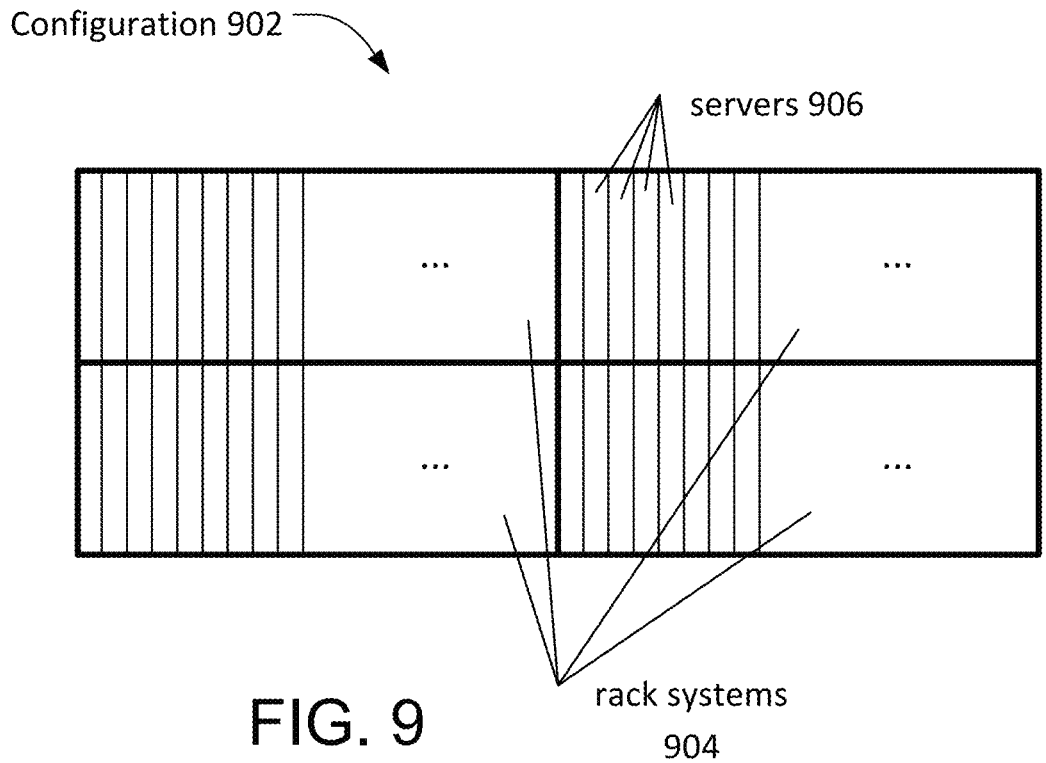
FIG. 9 shows a configuration of numerous rack systems, arranged to fit within one side of a 20-foot transport container, in accordance with various embodiments of the disclosure.

To provide for scalable data centers, as well as to provide environmental benefits from recycling, the rack system of the disclosure may be configured for use in recycled transport containers. FIG. 9 shows a configuration 902 of four rack systems 904, each of which holds 48 servers 906. The configuration 902 is approximately 5.4 meters in length, and approximately 0.6 meters deep, and fits on one side of a 20 foot transport container, while leaving sufficient space for cables and tubes or pipes for conveying liquid. A total of 192 servers 906 may be held in the configuration 902, each of which may be cooled as described above.

Figure 10:
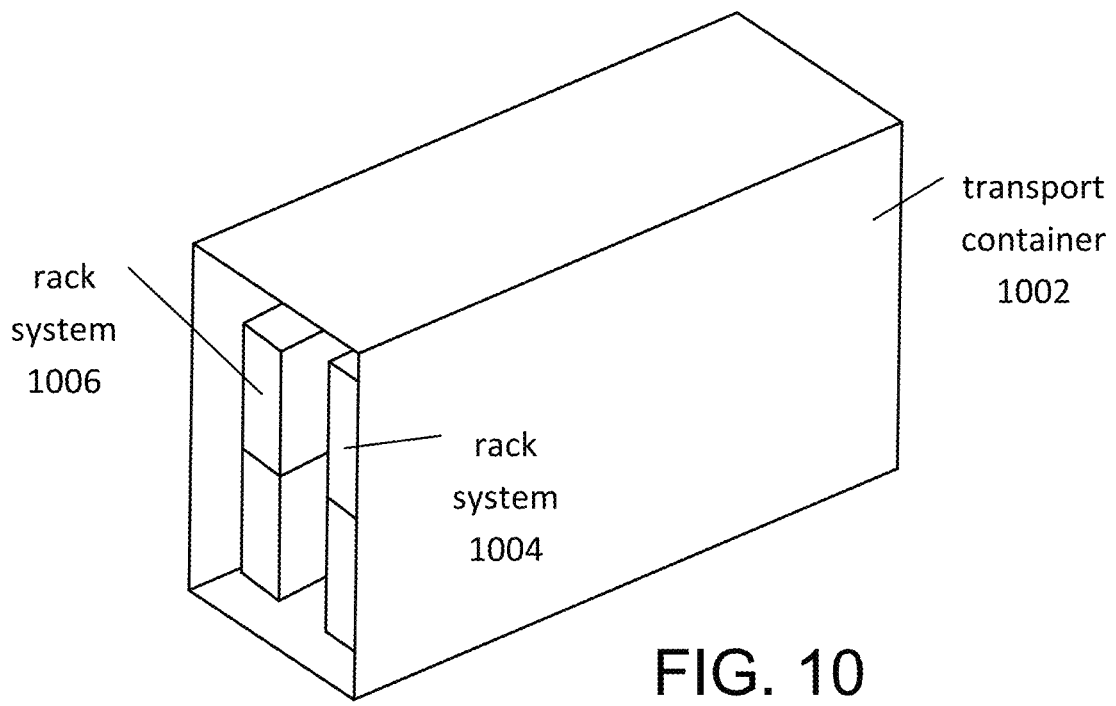
FIG. 10 shows a container-based data center module, in accordance with various embodiments of the disclosure.

FIG. 10 shows a 20-foot transport container 1002, containing rack systems 1004 and 1006, each of which is similar to the rack configuration 902 described with reference to FIG. 9. This means that the container 1002 may hold 376 servers immersion cooled as disclosed above, as well as cables and tubes or pipes for the liquid cooling system. Such a container may be a module in a larger container-based data center.

Figure 11:
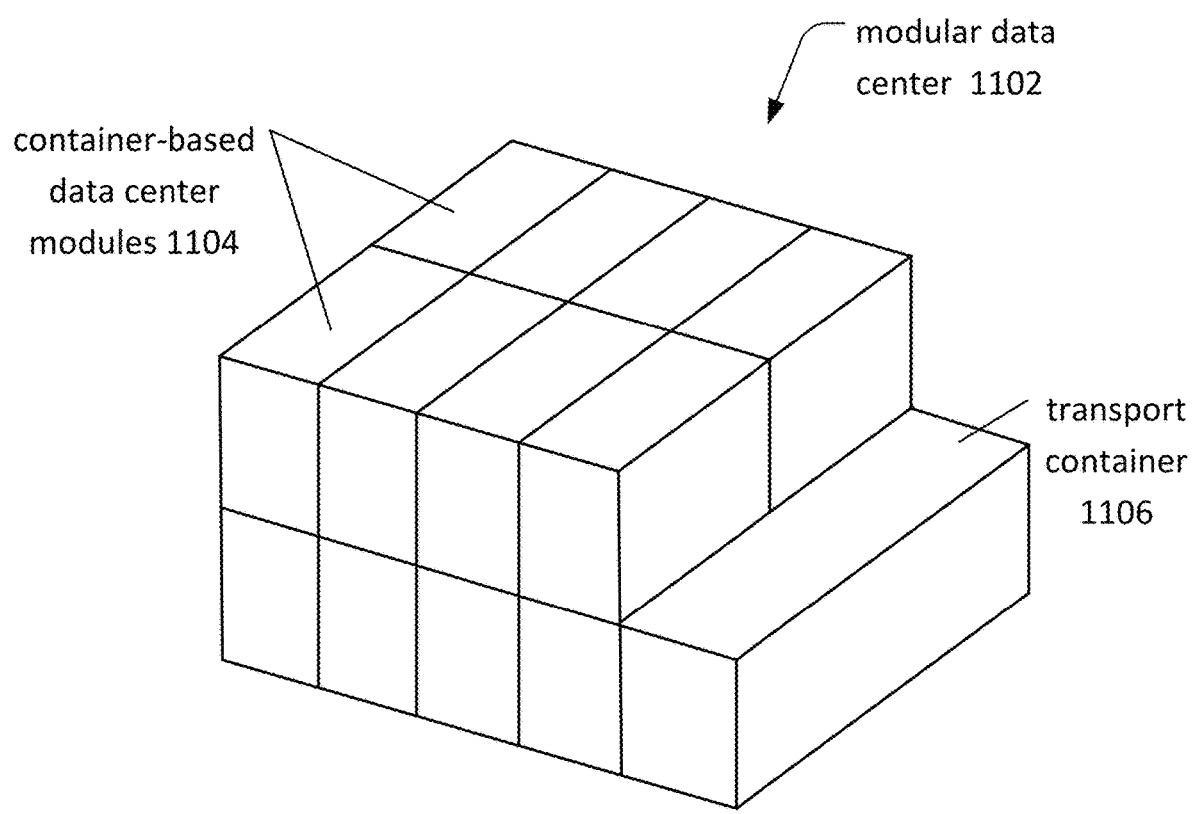
FIG. 11 shows a modular data center, in accordance with various embodiments of the disclosure.

FIG. 11 shows a modular data center 1102, in which container-based data center modules 1104, which have contents similar to the container 1002 described above, are arranged in a stack that is two containers 1104 high, two modules 1104 deep, and four modules 1104 wide. Thus, the data center 1102 includes approximately 6000 servers, all cooled as described above. The container-based data center modules 1104 have a footprint of approximately 120 square meters, so the data center includes approximately 50 servers per square meter of footprint. Given a "typical" power usage of current servers, it is expected that the power dissipation will be approximately eight kilowatts per square meter. To hold the heat exchangers (not shown) and/or other conventional cooling systems (not shown) for cooling the liquid that circulates through the data center 1102, an additional 40-foot transport container 1106 that includes this infrastructure may be used with the data center 1102. In some embodiments, the container 1106 may also include conventional equipment (not shown) for providing power to the data center 1102.

It will be understood that, although the embodiments presented herein have been described with reference to specific features and structures, various modifications and combinations may be made without departing from the disclosure. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A rack system comprising:
a rack frame and a rack-mounted assembly, including an electronic device disposed within the rack-mounted assembly, the electronic device including a heat-generating component, wherein:
the heat-generating component is in thermal contact with a liquid cooling block through which a channelized cooling fluid is conveyed;
the electronic device is immersed in a dielectric immersion cooling liquid; and
the rack-mounted assembly includes a non-sealed immersion case in which the electronic device is immersed in the dielectric immersion cooling liquid, the non-sealed immersion case configured to be non-sealed at all times, including during operation of the electronic device, such that the non-sealed immersion cooling case cannot be used for dual-phase immersion cooling, the non-sealed immersion case further configured to permit the rack-mounted assembly to be individually inserted into or removed from the rack frame, wherein:
the dielectric immersion cooling liquid is contained within the non-sealed immersion case and circulates within the non-sealed immersion case due to convection induced by a convection-inducing element included in the rack-mounted assembly, the convection-inducing element being in thermal contact with at least a portion of the dielectric immersion cooling liquid and configured to induce convection within the dielectric immersion cooling liquid, and wherein the channelized cooling fluid is conveyed through the convection-inducing element.

2. The rack system according to claim 1, wherein the rack-mounted assembly is mounted vertically with respect to the rack frame.

3. The rack system according to claim 1, wherein the convection-inducing element comprises a serpentine convection coil.

4. The rack system according to claim 1, wherein the channelized cooling fluid is conveyed through a loop that includes both the liquid cooling block in thermal contact with the heat-generating component and the convection-inducing element.

5. The rack system according to claim 1, wherein a density of the dielectric immersion cooling liquid is lower than a density of the channelized cooling fluid.

6. The rack system according to claim 1, wherein the channelized cooling fluid is a same type of fluid as the dielectric immersion cooling liquid.

7. The rack system according to claim 1, wherein the rack-mounted assembly is vertically oriented within the rack frame and a plurality of other vertically oriented rack-mounted assemblies are mounted adjacent to each other in the rack frame.

8. A rack system comprising:
a rack frame and a rack-mounted assembly, including an electronic device disposed within the rack-mounted assembly, the electronic device including a heat-generating component, wherein:
the heat-generating component is in thermal contact with a liquid cooling block through which a channelized cooling fluid is conveyed;
the electronic device is immersed in a dielectric immersion cooling liquid, wherein a density of the dielectric immersion cooling liquid is lower than a density of the channelized cooling fluid; and
the rack-mounted assembly includes a non-sealed immersion case in which the electronic device is immersed in the dielectric immersion cooling liquid, the non-sealed immersion case configured to be non-sealed at all times, including during operation of the electronic device, such that the non-sealed immersion cooling case cannot be used for dual-phase immersion cooling, the non-sealed immersion case further configured to permit the rack-mounted assembly to be individually inserted into or removed from the rack frame, wherein:
the dielectric immersion cooling liquid is contained within the non-sealed immersion case and circulates within the non-sealed immersion case due to convection induced by a convection-inducing element included in the rack-mounted assembly, the convection-inducing element being in thermal contact with at least a portion of the dielectric immersion cooling liquid and configured to induce convection within the dielectric immersion cooling liquid, and wherein the channelized cooling fluid is conveyed through the convection-inducing element.

9. The rack system according to claim 8, wherein the rack-mounted assembly is mounted vertically with respect to the rack frame.

10. The rack system according to claim 8, wherein the convection-inducing element comprises a serpentine convection coil.

11. The rack system according to claim 8, wherein the channelized cooling fluid is conveyed through a loop that includes both the liquid cooling block in thermal contact with the heat-generating component and the convection-inducing element.

12. The rack system according to claim 8, wherein the channelized cooling fluid is a same type of fluid as the dielectric immersion cooling liquid.

13. A modular data center comprising a plurality of container-based data center modules, the plurality of container-based data center modules comprising a plurality of rack systems, wherein each rack system comprises:
a rack frame and a rack-mounted assembly, including an electronic device disposed within the rack-mounted assembly, the electronic device including a heat-generating component, wherein:
the heat-generating component is in thermal contact with a liquid cooling block through which a channelized cooling fluid is conveyed;
the electronic device is immersed in a dielectric immersion cooling liquid having a lower density than the channelized cooling fluid; and
the rack-mounted assembly includes a non-sealed immersion case in which the electronic device is immersed in the dielectric immersion cooling liquid, the non-sealed immersion case configured to be non-sealed at all times, including during operation of the electronic device, such that the non-sealed immersion cooling case cannot be used for dual-phase immersion cooling, the non-sealed immersion case further configured to permit the rack-mounted assembly to be individually inserted into or removed from the rack frame.

14. The modular data center according to claim 13, wherein each rack-mounted assembly is mounted vertically.

15. The modular data center according to claim 13, wherein the channelized cooling fluid in the rack system is conveyed through a loop that includes both the liquid cooling block in thermal contact with the heat-generating component and a convection-inducing element.

16. The modular data center according to claim 15, wherein the convection-inducing element in the rack system comprises a serpentine convection coil, the convection-inducing element being in thermal contact with at least a portion of the dielectric immersion cooling liquid and configured to induce convection within the dielectric immersion cooling liquid, and wherein the channelized cooling fluid is conveyed through the convection-inducing element.

* * * * *